(12) United States Patent
Park et al.

(10) Patent No.: US 11,177,333 B2
(45) Date of Patent: Nov. 16, 2021

(54) DISPLAY DEVICE HAVING A STORAGE CAPACITOR

(71) Applicant: SAMSUNG DISPLAY CO., LTD., Yongin-si (KR)

(72) Inventors: Jun Hyun Park, Suwon-si (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/735,962

(22) Filed: Jan. 7, 2020

(65) Prior Publication Data

US 2020/0235183 A1 Jul. 23, 2020

(30) Foreign Application Priority Data

Jan. 18, 2019 (KR) .......................... 10-2019-0007076

(51) Int. Cl.
*H01L 29/12* (2006.01)
*H01L 27/32* (2006.01)

(52) U.S. Cl.
CPC ...... *H01L 27/3265* (2013.01); *H01L 27/3262* (2013.01)

(58) Field of Classification Search
CPC ............. H01L 27/3265; H01L 27/3262; H01L 27/3248; H01L 27/3258
See application file for complete search history.

(56) References Cited

U.S. PATENT DOCUMENTS

2013/0221381 A1  8/2013  Shin et al.
2015/0097172 A1  4/2015  Han et al.
(Continued)

FOREIGN PATENT DOCUMENTS

JP       2017-173505       9/2017
KR  10-2018-0024909       3/2018
(Continued)

OTHER PUBLICATIONS

European Search Report dated May 20, 2020 in corresponding European Patent Application No. 20151288.6.

*Primary Examiner* — Phuc T Dang
(74) *Attorney, Agent, or Firm* — F. Chau & Associates, LLC

(57) ABSTRACT

A display device having high resolution includes: a first conductive layer, an active pattern, second to fourth conductive layers, and a pixel electrode sequentially formed on a substrate, with first to fourth insulating layers separately interposed therebetween, the first conductive layer including a lower pattern, the active pattern including a source region, a channel region, and a drain region, the second conductive layer including a gate electrode overlapping the channel region and a driving gate electrode connected to the gate electrode, the third conductive layer including a capacitor electrode overlapping the driving gate electrode, the fourth conductive layer including an additional capacitor electrode overlapping the capacitor electrode. The driving gate electrode and the capacitor electrode may form a storage capacitor, the pixel electrode and the additional capacitor electrode may form a first additional capacitor, and the capacitor electrode and the additional capacitor electrode may form a second additional capacitor.

17 Claims, 11 Drawing Sheets

(56) References Cited

U.S. PATENT DOCUMENTS

| | | | |
|---|---|---|---|
| 2015/0179724 A1* | 6/2015 | Lee | H01L 29/7869 |
| | | | 257/40 |
| 2015/0243722 A1 | 8/2015 | Kwon et al. | |
| 2015/0279872 A1 | 10/2015 | Kato et al. | |
| 2016/0372497 A1 | 12/2016 | Lee et al. | |
| 2017/0338252 A1 | 11/2017 | Lee et al. | |
| 2018/0342570 A1* | 11/2018 | Hong | H01L 27/326 |
| 2019/0189721 A1* | 6/2019 | Kim | H01L 51/5237 |
| 2019/0189722 A1* | 6/2019 | Lim | H01L 27/3265 |

FOREIGN PATENT DOCUMENTS

| | | |
|---|---|---|
| KR | 10-2018-0047540 | 5/2018 |
| KR | 10-2018-0047579 | 5/2018 |

\* cited by examiner

DISPLAY DEVICE HAVING A STORAGE CAPACITOR

CROSS-REFERENCE TO RELATED APPLICATION

This application claims priority under 35 U.S.C. § 119 to and the benefit of Korean Patent Application No. 10-2019-0007076, filed on Jan. 18, 2019, in the Korean Intellectual Property Office, the entire contents of which are incorporated by reference herein.

TECHNICAL FIELD

Exemplary embodiments of the present invention relate to a display device, and more particularly, to an organic light emitting display having high resolution.

DISCUSSION OF RELATED ART

Among various display devices, an organic light emitting diode display has high luminance, low power consumption, wide viewing angles, excellent contrast, and fast response speeds, and thus, has attracted attention as a next-generation display device for displaying an image. Also, unlike a liquid crystal display, the organic light emitting diode display has a self-emission characteristic and does not require an additional light source, rendering the possibility of reducing its thickness and weight.

The organic light emitting diode display has a complicated pixel structure as compared with the liquid crystal display, thus it is difficult to secure a reduced space for forming pixels as a resolution thereof increases. As the space occupied by the pixels is reduced, a space for forming a storage capacitor is also reduced, thus the storage capacitor maintaining a certain level of voltage for a period of one frame may not be secured.

The information disclosed above is only for enhancement of understanding of the background of the invention, and therefore it may contain information that does not form the prior art that is already known in this country to a person of ordinary skill in the art.

SUMMARY

Exemplary embodiments of the present invention provide a high resolution organic light emitting display device in which capacity of a storage capacitor connected to a driving transistor is increased.

According to an exemplary embodiment of the present invention, a display device includes: a substrate; a first conductive layer including a lower pattern disposed on the substrate; a first insulating layer disposed on the first conductive layer; an active pattern disposed on the first insulating layer and including a source region, a channel region, and a drain region; a second conductive layer disposed on the active pattern and including a gate electrode overlapping the channel region and a driving gate electrode connected to the gate electrode; a second insulating layer disposed on the second conductive layer; a third conductive layer disposed on the second insulating layer and including a capacitor electrode overlapping the driving gate electrode; a third insulating layer disposed on the third conductive layer; a fourth conductive layer disposed on the third insulating layer and including an additional capacitor electrode overlapping the capacitor electrode; a fourth insulating layer disposed on the fourth conductive layer; and a pixel electrode layer including a pixel electrode disposed on the fourth insulating layer, in which the driving gate electrode and the capacitor electrode may form a storage capacitor, the pixel electrode and the additional capacitor electrode may form a first additional capacitor, and the capacitor electrode and the additional capacitor electrode may form a second additional capacitor.

The driving gate electrode and the additional capacitor electrode may be electrically connected to each other.

The additional capacitor electrode may be connected to the driving gate electrode through a contact hole formed in the second insulating layer and the third insulating layer in a region overlapping the driving gate electrode and not overlapping the capacitor electrode.

The lower pattern, the capacitor electrode, and the pixel electrode may be electrically connected to each other.

The lower pattern may overlap the gate electrode to form an overlap capacitor.

The third conductive layer may further include a data line spaced apart from the capacitor electrode, and the fourth conductive layer may further include a first contact portion disposed at an end portion of the data line and contacting the end portion.

The fourth conductive layer may further include a second contact portion disposed between the pixel electrode and the capacitor electrode and contacting the pixel electrode and the capacitor electrode.

The additional capacitor electrode may be electrically separated from the second contact portion.

According to an exemplary embodiment of the present invention, a display device includes: a substrate; a first conductive layer including a lower pattern disposed on the substrate; a first insulating layer disposed on the first conductive layer; an active pattern disposed on the first insulating layer and including a source region, a channel region, and a drain region; a second conductive layer disposed on the active pattern and including a gate electrode overlapping the channel region and a driving gate electrode connected to the gate electrode; a second insulating layer disposed on the second conductive layer; a third conductive layer disposed on the second insulating layer and including a data line and an additional capacitor electrode; a third insulating layer disposed on the third conductive layer; a fourth conductive layer disposed on the third insulating layer and including a first contact portion disposed on an end portion of the data line and contacting the end portion; a fourth insulating layer disposed on the fourth conductive layer; a pixel electrode layer as a fifth conductive layer including a pixel electrode disposed on the fourth insulating layer; a fifth insulating layer disposed on the fourth insulating layer; a sixth insulating layer disposed between the second conductive layer and the second insulating layer; and a sixth conductive layer disposed between the sixth insulating layer and the second insulating layer and including a capacitor electrode overlapping the driving gate electrode, in which the driving gate electrode and the capacitor electrode may form a storage capacitor, the pixel electrode and the additional capacitor electrode may form a first additional capacitor, and the capacitor electrode and the additional capacitor electrode may form a second additional capacitor.

The driving gate electrode and the additional capacitor electrode may be electrically connected to each other.

The additional capacitor electrode may be connected to the driving gate electrode through a contact hole formed in the second insulating layer and the sixth insulating layer in a region overlapping the driving gate electrode and not overlapping the capacitor electrode.

The lower pattern, the capacitor electrode, and the pixel electrode may be electrically connected to each other.

The lower pattern may overlap the gate electrode to form an overlap capacitor.

The fourth conductive layer may further include a second contact portion disposed between the pixel electrode and the capacitor electrode and contacting the pixel electrode and the capacitor electrode.

According to an exemplary embodiment of the present invention, a display device includes: a light emitting diode; a first transistor including a source electrode connected to a driving voltage line that transmits a driving voltage, and a drain electrode connected to an anode of the light emitting diode; a storage capacitor provided with one end connected to a first gate electrode of the first transistor and an other end connected to the drain electrode of the first transistor; and first and second additional capacitors each provided with one end connected to the first gate electrode of the first transistor and an other end connected to the drain electrode of the first transistor, in which the one end of the storage capacitor may correspond to a driving gate electrode connected to the first gate electrode, and the other end of the storage capacitor may correspond to a capacitor electrode overlapping the driving gate electrode, the one end of the first additional capacitor may correspond to the additional capacitor electrode overlapping the capacitor electrode, and the other end of the first additional capacitor may correspond to an anode of the light emitting diode, and the one end of the second additional capacitor may correspond to the additional capacitor electrode, and the other end of the second additional capacitor may correspond to the capacitor electrode.

The driving gate electrode and the additional capacitor electrode may be electrically connected to each other.

The capacitor electrode and the anode of the light emitting diode may be electrically connected to each other.

The capacitor electrode may be disposed in a layer the same as that of the driving voltage line, and the additional capacitor electrode may be disposed in a layer between the capacitor electrode and the anode of the light emitting diode.

The capacitor electrode may be disposed in a layer between the first gate electrode of the first transistor and the driving voltage line, and the additional capacitor electrode may be disposed in a layer the same as that of the driving voltage line.

The display device may further include a lower pattern overlapping the first gate electrode of the first transistor, the lower pattern and the first gate electrode may form an overlap capacitor.

According to an exemplary embodiment of the present invention, a display device includes: a substrate; a first conductive layer including a lower pattern disposed on the substrate; a first insulating layer disposed on the first conductive layer; an active pattern disposed on the first insulating layer and including a first source region, a first channel region, and a first drain region of a first transistor; a second conductive layer disposed on the active pattern and including a first gate electrode overlapping the lower pattern to form an overlap capacitor, and a driving gate electrode connected to the first gate electrode of the first transistor; a second insulating layer disposed on the second conductive layer; a third conductive layer disposed on the second insulating layer and including a capacitor electrode configured to overlap the driving gate electrode to form a storage capacitor; a third insulating layer disposed on the third conductive layer; a fourth conductive layer disposed on the third insulating layer and including an additional capacitor electrode configured to overlap the capacitor electrode to form a first additional capacitor; a fourth insulating layer disposed on the fourth conductive layer; and a pixel electrode layer including a pixel electrode disposed on the fourth insulating layer and configured to overlap the additional capacitor electrode to form a second additional capacitor.

The first source region may be connected to a driving voltage line that transmits a driving voltage, and the first drain region may be connected to the pixel electrode that is an anode of a light emitting diode.

The display device may further include: a second transistor configured to be able to transmit a data voltage to the first transistor and including a second gate electrode, a second source region, a second channel region, and a second drain region, in which the second drain region, the first gate electrode, the driving gate electrode and the additional capacitor electrode may be electrically connected to each other.

The high resolution organic light emitting display device according to the present invention may have sufficient capacitance even in a narrow area by including additional capacitors to assist a storage capacitor.

BRIEF DESCRIPTION OF THE DRAWINGS

These and/or other aspects of the present invention will become apparent and more readily appreciated from the following description of the embodiments, taken in conjunction with the accompanying drawings, in which.

Figure 1:
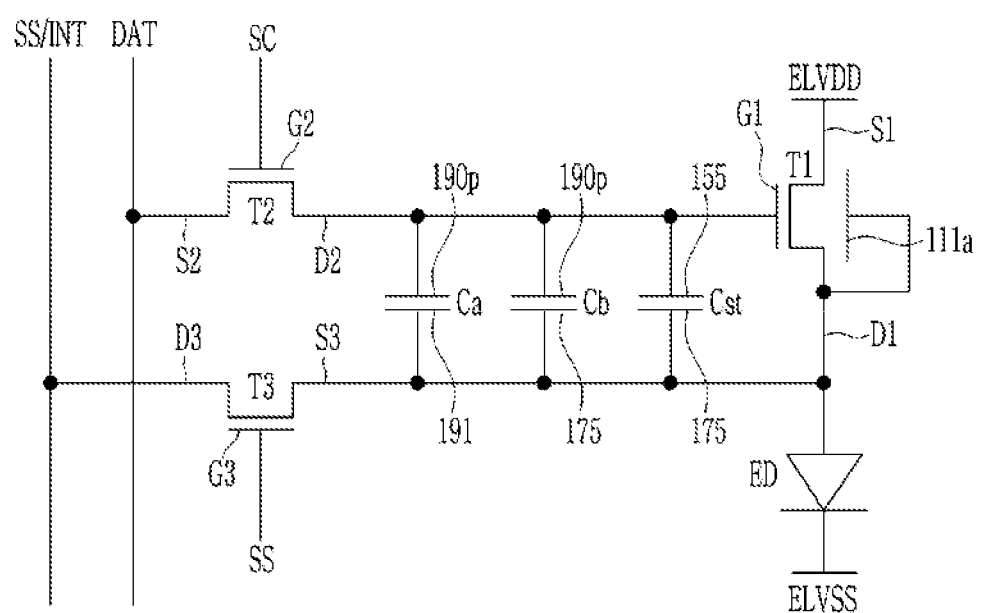
FIG. 1 is an equivalent circuit diagram of one pixel of a display device according to an exemplary embodiment of the present invention.

Since the drawings in FIGS. 1-11 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Exemplary embodiments of the present invention will be described more fully hereinafter with reference to the accompanying drawings, in which the exemplary embodiments of the present invention are shown. As those skilled in the art would realize, the described exemplary embodiments may be modified in various different ways, all without departing from the spirit and scope of the present invention.

Parts that are irrelevant to the description will be omitted to clearly describe the present invention, and like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that the spatially relative terms are intended to encompass different orientations of the device in use or operation in addition to the orientation depicted in the figures. For example, in the specification, the word "on" or "above" may also mean disposed on or below the object portion, and does not necessarily mean disposed on the upper side of the object portion based on a gravitational direction.

Unless explicitly described to the contrary, the word "comprise" and variations such as "comprises" and/or "comprising" will be understood to imply the inclusion of stated elements but not the exclusion of any other elements.

Throughout this specification, a plan view means a view when observing a surface parallel to two directions (e.g., a first direction DR1 and a second direction DR2) crossing each other, and a cross-sectional view means a view when observing a surface cut in a direction (e.g., a third direction) perpendicular to the surface parallel to the first direction DR1 and the second direction DR2. Also, to overlap two constituent elements means that two constituent elements are overlapped in the third direction (e.g., a direction perpendicular to an upper surface of the substrate) unless stated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, and vice versa, without departing from the teachings of the present invention.

Hereinafter, a display device according to an exemplary embodiment of the present invention will be described with reference to FIG. 1 to FIG. 5.

FIG. 1 is an equivalent circuit diagram of one pixel of a display device according to an exemplary embodiment of the present invention.

Referring to FIG. 1, the display device according to the present exemplary embodiment includes a plurality of pixels, and one of the plurality of pixels may include a plurality of transistors T1, T2, and T3, a storage capacitor Cst, additional capacitors Ca and Cb, and a light emitting diode ED. The additional capacitors Ca and Cb may include a first additional capacitor Ca and a second additional capacitor Cb. In the present exemplary embodiment, one pixel including one light emitting diode ED will be exemplarily described.

The plurality of transistors T1, T2, and T3 include a first transistor T1, a second transistor T2, and a third transistor T3. A source electrode and a drain electrode, which will be described below, are used to distinguish two electrodes disposed on opposite sides of a channel of each of the transistors T1, T2, and T3, and they may be interchanged without affecting the functions thereof.

Each of the storage capacitor Cst, the first additional capacitor Ca and the second additional capacitor Cb has two ends. A gate electrode G1 of the first transistor T1 is connected to one end of the storage capacitor Cst. The gate electrode G1 of the first transistor T1 may also be connected to one end of the first additional capacitor Ca, and one end of the second additional capacitor Cb. A source electrode S1 of the first transistor T1 is connected to a driving voltage line for transmitting a driving voltage ELVDD. A drain electrode D1 of the first transistor T1 is connected to an anode of the light emitting diode ED and the other end of the storage capacitor Cst. The drain electrode D1 of the first transistor T1 may also be connected to the other end of the first additional capacitor Ca, and the other end of the second additional capacitor Cb. The first transistor T1 may receive a data voltage DAT in accordance with a switching operation of the second transistor T2, store the data voltage DAT in the storage capacitor Cst and the additional capacitors Ca and Cb, and supply a driving current to the light emitting diode ED in accordance with a voltage stored in the storage capacitor Cst and the additional capacitors Ca and Cb. Thus, the first transistor T1 may serve as a driving transistor, and the second transistor T2 may serve as a switching transistor for the display device.

In an exemplary embodiment of the present invention, the first transistor T1 may further include a lower pattern 111a under a semiconductor layer where the channel is disposed. The lower pattern 111a overlaps the channel and the gate electrode G1 (see FIG. 3) of the first transistor T1 to enhance characteristics of the first transistor T1 and to maintain a voltage of the gate electrode G1. The voltage of the gate electrode G1 may be maintained by the overlapping of the lower pattern 111a and the gate electrode G1 to assist a role of the storage capacitor Cst. Hereinafter, a capacitor added by overlapping between the lower pattern 111a and the gate electrode of the first transistor T1 is referred to as an overlap capacitor. The lower pattern 111a is electrically connected to the drain electrode D1 of the first transistor T1, and thus it is also connected to the anode of the light emitting diode ED. Accordingly, the lower pattern 111a may also be electrically connected to the other ends of the storage capacitor Cst, the first additional capacitor Ca, and the second additional capacitor Cb. A gate electrode G2 of the second transistor T2 is connected to a first scan line for transmitting a first scan signal SC. A source electrode S2 of the second transistor T2 is connected to a data line capable of transmitting the data voltage DAT or a reference voltage. A drain electrode D2 of the second transistor T2 is connected to the gate electrode G1 of the first transistor T1. The drain electrode D2 of the second transistor T2 may be connected to one end of the storage capacitor Cst, and one ends of the additional capacitors Ca and Cb. The second transistor T2 is turned on in response to the first scan signal SC to be able to transmit the reference voltage or the data voltage DAT to the gate electrode G1 of the first transistor T1, one end of the storage capacitor Cst, and one ends of the additional capacitors Ca and Cb.

A gate electrode G3 of the third transistor T3 is connected to a second scan line for transmitting a second scan signal SS. A source electrode S3 of the third transistor T3 is connected to the other end of the storage capacitor Cst, the drain electrode D1 of the first transistor T1, and the anode of the light emitting diode ED. The source electrode S3 of the third transistor T3 may also be connected to the other end of the first additional capacitor Ca, and the other end of the second additional capacitor Cb. A drain electrode D3 of the third transistor T3 is connected to an initializing voltage line for transmitting an initializing voltage INT. The initializing voltage line may be used as a wire for providing the initializing voltage INT and for sensing a voltage of the anode of the light emitting diode ED connected to the source electrode S3 of the third transistor T3 according to a section. The third transistor T3 is turned on in response to the second scan signal SS to transmit the initializing voltage INT to the anode of the light emitting diode ED, the other end of the storage capacitor Cst, and the other ends of the additional capacitors Ca and Cb, thereby initializing the anode of the light emitting diode ED. When the second scan signal SS is applied as a gate-on voltage in a light emitting section in which the light emitting diode ED emits light, the initializing voltage line operates as a sensing line, thus the anode voltage of the light emitting diode ED may be transmitted to a sensing portion through the sensing line. When the voltage sensed through the sensing line is determined to be different from an expected anode voltage based on the applied data voltage DAT, the data voltage DAT may be modified to be provided to a pixel. That is, characteristics of the first transistor T1 may be changed, and by sensing the changed characteristics thereof to provide the data voltage DAT corresponding thereto, it is possible to allow the light emitting diode ED to normally emit light. For example, the data voltage DAT modification based on the voltage sensed through the sensing line as described above can be carried out for a predetermined time allowed during the operation of a screen. Thus, it is possible to sense and compensate for the characteristics, that change in real time, of the first transistor T1, and to allow the light emitting diode ED to normally emit light.

One end of the storage capacitor Cst is connected to the gate electrode G1 of the first transistor T1. The other end of the storage capacitor Cst is connected to the drain electrode D1 of the first transistor T1, the source electrode S3 of the third transistor T3, and the anode of the light emitting diode ED. One end of the storage capacitor Cst and the other end of the storage capacitor Cst may be two conductive electrodes facing each other with one insulating layer interposed therebetween. For example, one end of the storage capacitor Cst may correspond to a driving gate electrode 155 to be described, and the other end of the storage capacitor Cst may correspond to a capacitor electrode 175 to be described. The driving gate electrode 155 may be connected to the first gate electrode 154a to be described, and the capacitor electrode 175 may overlap the driving gate electrode 155 to form the storage capacitor Cst.

The storage capacitor Cst may serve to maintain the data voltage DAT and the anode voltage of the light emitting diode ED (the voltage of the drain electrode D1 of the first transistor T1) for one frame.

As an area occupied by pixels in an organic light emitting display device with high resolution is reduced, an area for forming the storage capacitor Cst is reduced, thus storage capacity that may be maintained for one frame may not be secured. Therefore, the pixel according to the present exemplary embodiment further includes the additional capacitors Ca and Cb to ensure a sufficient storage capacity for maintaining the anode voltage of the light emitting diode ED for one frame.

One end of the first additional capacitor Ca is connected to the gate electrode G1 of the first transistor T1. The other end of the first additional capacitor Ca is connected to the source electrode S3 of the third transistor T3 and the anode of the light emitting diode ED. One end of the first additional capacitor Ca may correspond to an additional capacitor electrode 190p to be described (see FIGS. 1 and 3), and the other end of the first additional capacitor Ca may correspond to a pixel electrode 191 which includes pixel electrodes 191a, 191b, and 191c to be described (see FIGS. 1 and 3). The additional capacitor electrode 190p may overlap the capacitor electrode 175, and the pixel electrode 191 may correspond to an anode of the light emitting diode ED. For example, the pixel electrode 191a may overlap the additional capacitor electrode 190p (see FIG. 3).

One end of the second additional capacitor Cb is connected to the gate electrode G1 of the first transistor T1. The other end of the second additional capacitor Cb is connected to the source electrode S3 of the third transistor T3 and the anode of the light emitting diode ED. One end of the second additional capacitor Cb may correspond to the additional capacitor electrode 190p to be described, and the other end of the second additional capacitor Cb may correspond to the capacitor electrode 175 to be described (see FIGS. 1 and 3).

The first additional capacitor Ca and the second additional capacitor Cb in combination with the storage capacitor Cst may serve to maintain the data voltage DAT and the anode voltage of the light emitting diode ED. That is, the first additional capacitor Ca and the second additional capacitor Cb may assist the storage capacitor Cst in ensuring sufficient storage capacity capable of maintaining the anode voltage of the light emitting diode ED during one frame. In an exemplary embodiment of the present invention, an overlap capacitor may be further formed by the lower pattern 111a. For example, the lower pattern 111a may overlap the first gate electrode 154a of the first transistor T1 to form the overlap capacitor (see FIG. 3).

In an exemplary embodiment of the present invention, the pixel may further include only the first additional capacitor Ca, or may further include only the second additional capacitor Cb. In addition, adjacent pixels may include the additional capacitors Ca and Cb of different sizes. In an exemplary embodiment of the present invention, the pixel may include one or more additional capacitors besides the additional capacitors Ca and Cb.

A cathode of the light emitting diode ED is connected to a common voltage line for transmitting a common voltage ELVSS. The light emitting diode ED may emit light according to a driving current outputted from the first transistor T1. For example, the first transistor T1 is a driving transistor that supplies the driving current to the light emitting diode ED to drive the light emitting diode ED.

Figure 2:
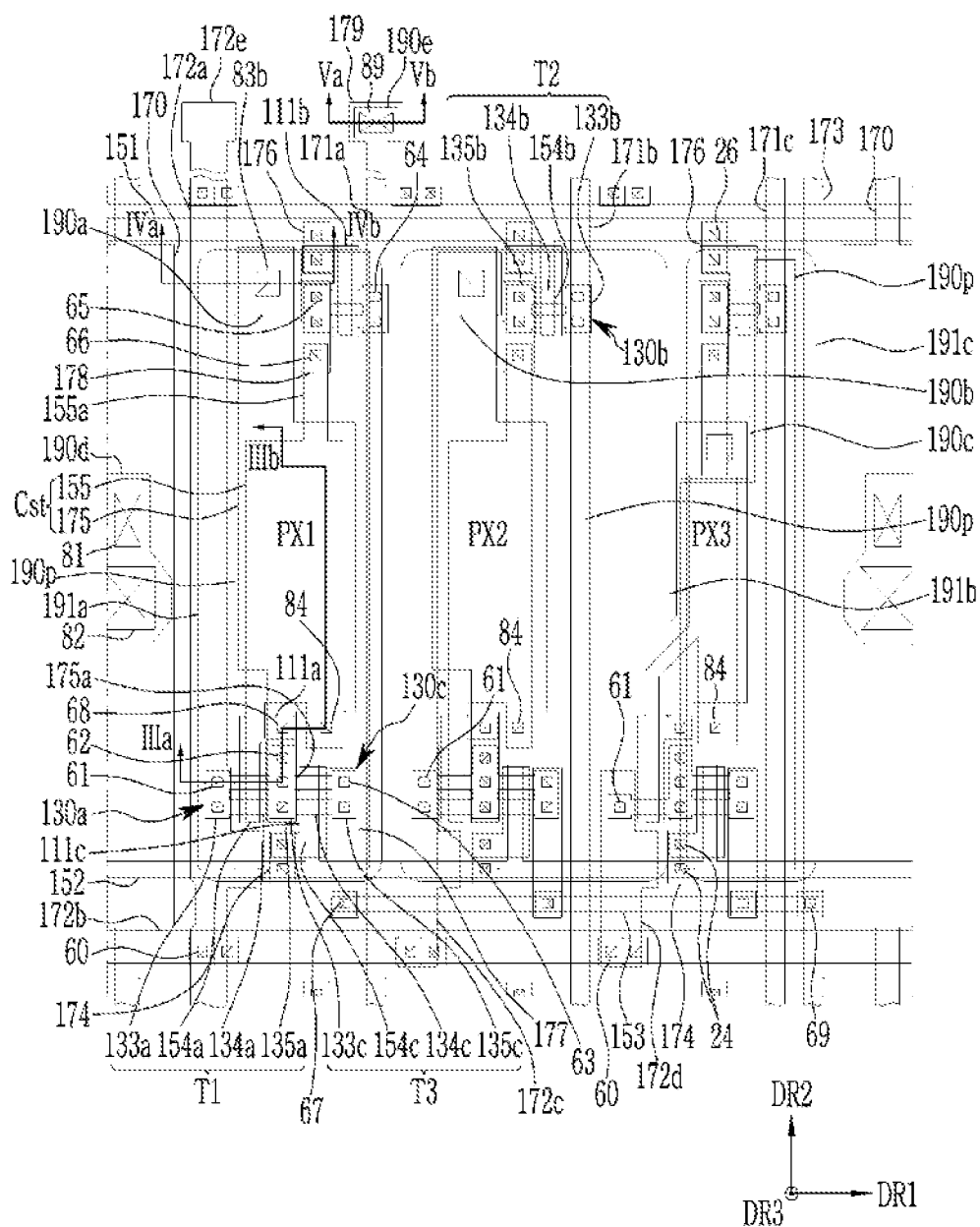
FIG. 2 is a plan layout view of a pixel region of a display device according to an exemplary embodiment of the present invention.
Figure 3:
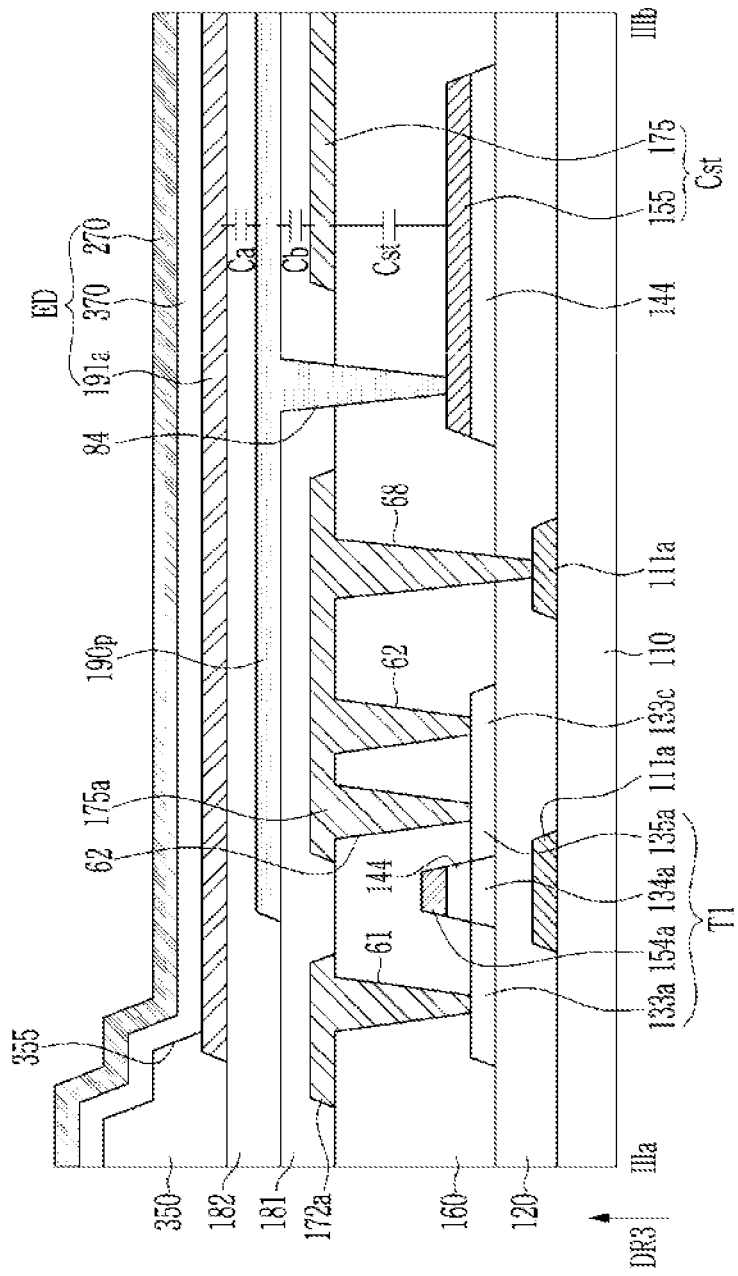
FIG. 3 is a cross-sectional view taken along line IIIa-IIIb of FIG. 2.
Figure 4:
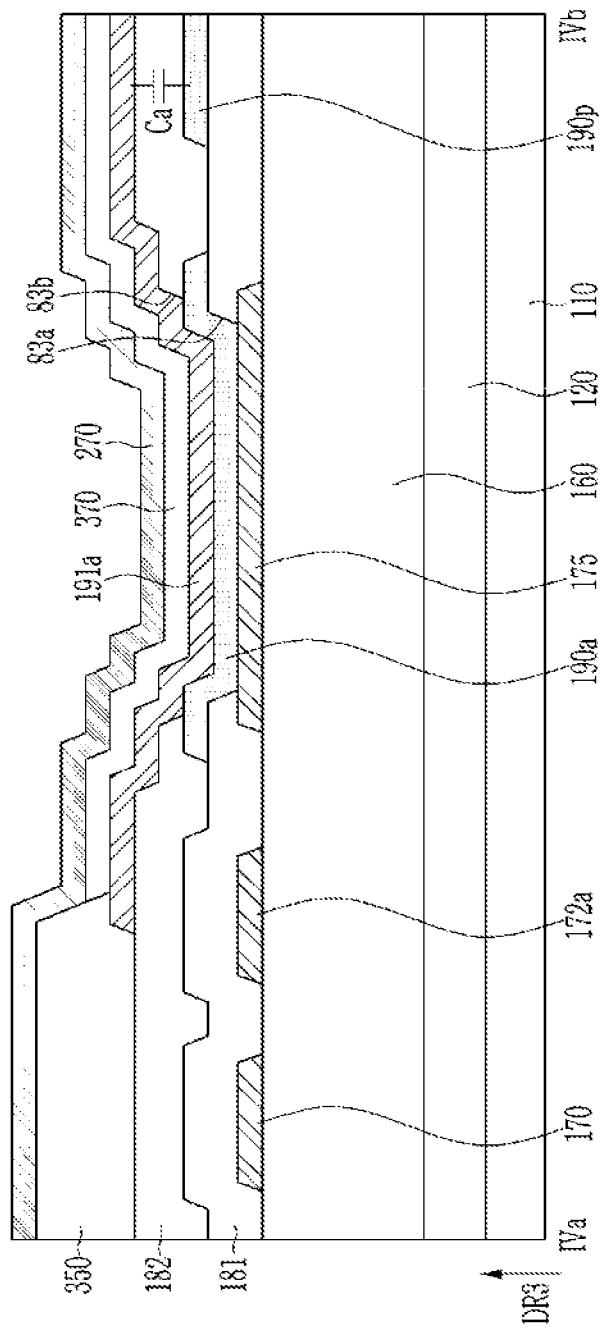
FIG. 4 is a cross-sectional view taken along line IVa-IVb of FIG. 2.
Figure 5:
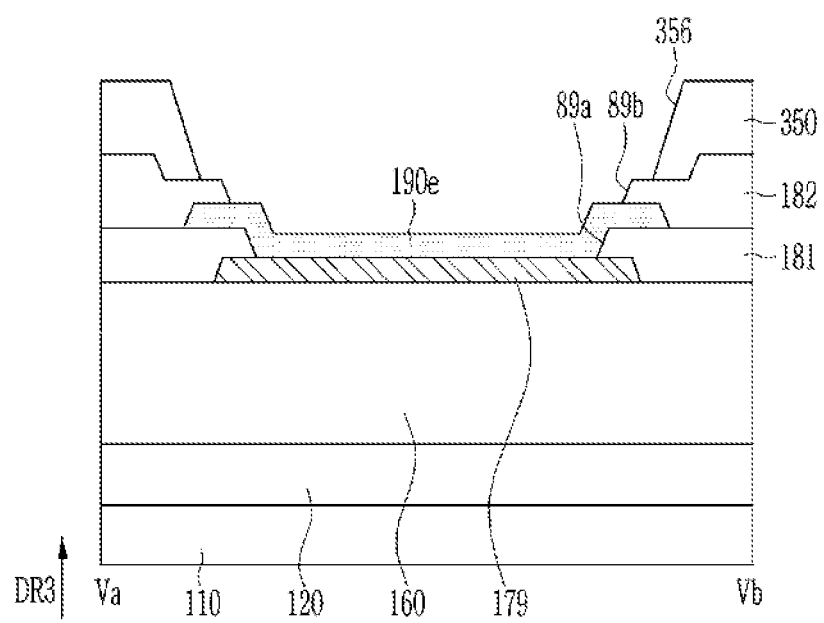
FIG. 5 is a cross-sectional view taken along line Va-Vb of FIG. 2.

FIG. 2 is a plan layout view of a pixel region of a display device according to an exemplary embodiment of the present invention. FIG. 3 is a cross-sectional view taken along line IIIa-IIIb of FIG. 2. FIG. 4 is a cross-sectional view taken along line IVa-IVb of FIG. 2. FIG. 5 is a cross-sectional view taken along line Va-Vb of FIG. 2.

Referring to FIG. 2 to FIG. 5, the display device according to an exemplary embodiment of the present invention may include a substrate 110. The substrate 110 may include an insulating material such as, for example, glass, ceramics, plastics, or the like, and may have flexibility.

A barrier layer, which is an insulating layer, may be disposed on the substrate 110, and a lower layer including a plurality of lower patterns 111a, 111b, and 111c is disposed thereon as a first conductive layer. The lower layer may be conductive, and may include various conductive metals or a semiconductor material having conductive properties equivalent to the various conductive metals. For example, the lower layer may include a semiconductor material doped with impurities.

A buffer layer 120, which is an insulating layer, is disposed on the lower layer. That is, the lower layer may be disposed between the substrate 110 and the buffer layer 120.

An active layer including a plurality of active patterns 130a, 130b, and 130c is disposed on the buffer layer 120. That is, the lower layer may be disposed between the substrate 110 and the active layer. The active patterns 130a, 130b, and 130c disposed at respective pixels PX1, PX2, and PX3 may include channel regions 134a, 134b, and 134c that form respective channels of the plurality of transistors T1, T2, and T3 described above, and conductive regions connected to the channel regions 134a, 134b, and 134c. The conductive regions of the active patterns 130a, 130b, and 130c include source regions 133a, 133b, and 133c and drain regions 135a, 135b, and 135c of respective transistors T1, T2, and T3, with the channel regions 134a, 134b, and 134c respectively interposed therebetween. In each of the pixels PX1, PX2, and PX3, the active pattern 130a and the active pattern 130c may be connected to each other. For example, the first transistor T1 and the third transistor T3 in each of the pixels PX1, PX2, and PX3 may be disposed next to each other with the active pattern 130a of the first transistor T1 and the active pattern 130c of the third transistor T3 connected to each other as shown in FIG. 2.

The active layer may include a semiconductor material such as, for example, amorphous silicon, polycrystalline silicon, or an oxide semiconductor.

An insulating pattern 144, which is a first insulating layer, is disposed on the active layer. For example, the insulating pattern 144 overlaps the channel regions 134a, 134b, and 134c of the active patterns 130a, 130b, and 130c, and may be disposed on the channel regions 134a, 134b, and 134c. The insulating pattern 144 may not substantially overlap the conductive regions of the active patterns 130a, 130b, and 130c. For example, the insulating pattern 144 may not overlap the source regions 133a, 133b, and 133c and the drain regions 135a, 135b, and 135c of the respective transistors T1, T2, and T3.

A second conductive layer may be disposed on the insulating pattern 144. The second conductive layer may include a first scan line 151 capable of transmitting the first scan signal SC described above, a second scan line 152 capable of transmitting the second scan signal SS, a horizontal initializing voltage line 153 capable of transmitting the initializing voltage INT, a horizontal driving voltage line 172b capable of transmitting the driving voltage ELVDD, and gate electrodes including a driving gate electrode 155, a first gate electrode 154a, a second gate electrode 154b, and a third gate electrode 154c. The gate electrode G1, the gate electrode G2, and the gate electrode G3 in the above-described circuit diagram correspond to the first gate electrode 154a, the second gate electrode 154b, and the third gate electrode 154c, respectively.

The first and second scan lines 151 and 152, the horizontal initializing voltage line 153, and the horizontal driving voltage line 172b may extend in the first direction DR1, respectively. The driving gate electrode 155 may be disposed between the first scan line 151 and the second scan line 152. The second gate electrode 154b may be connected to the first scan line 151, and protrude downward from the first scan line 151 in the second direction DR2. For example, the second gate electrode 154b (G2 in FIG. 1) of the second transistor T2 may be connected to the first scan line 151 for transmitting the first scan signal SC as shown in the above-described circuit diagram (see FIGS. 1 and 2). The third gate electrode 154c may be connected to the second scan line 152, and protrude upward from the second scan line 152 in the second direction DR2. For example, the third gate electrode 154c (G3 in FIG. 1) of the third transistor T3 may be connected to the second scan line 152 for transmitting a second scan signal SS as shown in the above-described circuit diagram (see FIGS. 1 and 2).

The driving gate electrode 155 disposed in the respective pixels PX1, PX2, and PX3 includes an extension portion 155a that protrudes upward and substantially extends in the second direction DR2, and a first gate electrode 154a that protrudes downward and substantially extends in the second direction DR2. The first gate electrode 154a disposed in the pixel PX3 may be bent at least twice in a portion connected to the driving gate electrode 155.

The active patterns 130a, 130b, and 130c may extend in the first direction DR1. The first gate electrode 154a substantially extends in the second direction DR2, crosses the active pattern 130a, and overlaps the channel region 134a of the active pattern 130a. The second gate electrode 154b substantially extends in the second direction DR2, crosses the active pattern 130b, and overlaps the channel region 134b of the active pattern 130b. The third gate electrode 154c substantially extends in the second direction DR2, crosses the active pattern 130c, and overlaps the channel region 134c of the active pattern 130c.

A second insulating layer 160 may be disposed on the second conductive layer. The buffer layer 120 and/or the second insulating layer 160 may include a plurality of contact holes 24, 26, 60, 61, 62, 63, 64, 65, 66, 67, 68, and 69.

A third conductive layer may be disposed on the second insulating layer 160. The third conductive layer may include a plurality of data lines 171a, 171b, and 171c, a driving voltage line 172a, a common voltage line 170, an initializing voltage line 173, a capacitor electrode 175, a plurality of connecting portions 174, 176, 177, and 178, and a plurality of driving voltage patterns 172c and 172d. For example, the capacitor electrode 175 may be disposed in a layer the same as that of the driving voltage line 172a. The plurality of contact holes 24, 26, 60, 61, 62, 63, 64, 65, 66, 67, 68, and 69 may be filled with conductive materials, so that the third conductive layer may be electrically connected to the first conductive layer, the second conductive layer, and/or the active patterns 130a, 130b, and 130c through these contact holes 24, 26, 60, 61, 62, 63, 64, 65, 66, 67, 68, and 69.

Each of the data lines 171a, 171b, and 171c, the driving voltage line 172a, the common voltage line 170, the initializing voltage line 173, and the driving voltage patterns 172c and 172d extends in the second direction DR2 to cross the first scan line 151 and/or the second scan line 152.

The plurality of pixels PX1, PX2, and PX3 as one repeated group shown in FIG. 2 may be arranged in the first direction DR1 and adjacent to each other. For example, the pixel PX3 of one group may be disposed between the pixel PX2 of the same group and the pixel PX1 of a neighboring group. The common voltage line 170 may be disposed on both the left and right sides of the plurality of pixels PX1, PX2, and PX3 of one group. That is, one common voltage line 170 may be disposed for each of the plurality of pixels PX1, PX2, and PX3 as the one repeated group. When the plurality of pixels PX1, PX2, and PX3 as the one repeated group include three pixels PX1, PX2, and PX3, three data lines 171a, 171b, and 171c, at least one driving voltage line 172a, and at least one initializing voltage line 173 may be disposed between two neighboring common voltage lines 170.

Each of the data lines 171a, 171b, and 171c is electrically connected to the source region 133b of the active pattern 130b through at least one contact hole 64 of the second insulating layer 160 (in FIG. 2, two contact holes 64 are shown in one pixel PX1, PX2, or PX3).

In FIG. 2, although an end portion 179 is shown only at one data line 171a, each of the data lines 171a, 171b, and 171c may include an end portion 179. The end portion 179 may be disposed in a pad region disposed at an edge of the display device.

The driving voltage line 172a may be disposed in one pixel, for example, the pixel PX1, and the driving voltage patterns 172c and 172d may be disposed in the remaining pixels PX2 and PX3, respectively. Each driving voltage line 172a may extend in the second direction DR2 to extend adjacent to the plurality of pixels. Like the data line 171a which may include the end portion 179, the driving voltage line 172a may include an end portion 172e disposed in the pad region.

Referring to FIGS. 2 and 3, the driving voltage line 172a and the driving voltage patterns 172c and 172d are electrically connected to the source region 133a of the active pattern 130a through at least one contact hole 61 of the second insulating layer 160 (in FIG. 2, two contact holes 61 are shown in the pixels PX1 and PX2, and one contact hole 61 is shown in the pixel PX3). The driving voltage line 172a and the driving voltage patterns 172c and 172d are electrically connected to the horizontal driving voltage line 172b through at least one contact hole 60 of the second insulating layer 160 (in FIG. 2, two contact holes 60 are shown in one pixel PX1, PX2, or PX3). Accordingly, the horizontal driving voltage line 172b and the driving voltage patterns 172c and 172d may transmit the driving voltage ELVDD together with the driving voltage line 172a, and the driving voltage ELVDD may be transmitted in a mesh form in all directions of the display device including the first direction DR1 and the second direction DR2. Thus, the source region 133a of the first transistor T1 may be electrically connected to the driving voltage line 172a, the horizontal driving voltage line 172b, and the driving voltage patterns 172c and 172d for transmitting the driving voltage ELVDD.

The initializing voltage line 173 is electrically connected to the horizontal initializing voltage line 153 through the contact hole 69 of the second insulating layer 160. Therefore, the horizontal initializing voltage line 153 may transmit the initializing voltage INT together with the initializing voltage line 173, and even if the initializing voltage line 173 is formed for each of the three pixels PX1, PX2, and PX3, the initializing voltage INT may be transmitted to all of the three pixels PX1, PX2, and PX3 through the horizontal initializing voltage lines 153. Thus, the drain region 135c of the third transistor T3 may be electrically connected to the initializing voltage line 173 and the horizontal initializing voltage line 153 for transmitting the initializing voltage INT.

The capacitor electrodes 175 may be disposed one by one in each of the pixels PX1, PX2, and PX3. The capacitor electrode 175 may overlap most of the corresponding driving gate electrode 155 with the second insulating layer 160 interposed therebetween to form the storage capacitor Cst (see FIG. 3).

The capacitor electrode 175 may include a downwardly protruding connecting portion 175a, for example protruding in the second direction DR2. The connecting portion 175a is connected to the drain region 135a of the active pattern 130a and the source region 133c of the active pattern 130c through at least one contact hole 62 of the second insulating layer 160 (three contact holes 62 are shown in one pixel PX1, PX2, or PX3 in FIG. 2). The drain region 135a of the first transistor T1 is connected to the source region 133c of the third transistor T3. The capacitor electrode 175 is electrically connected to the lower pattern 111a through the contact hole 68 of the second insulating layer 160 and the buffer layer 120 (the connection portion 175a is connected to the lower pattern 111a through the contact hole 68 in FIG. 3). For example, the lower pattern 111a may be electrically connected to the drain region 135a of the first transistor T1, and the source region 133c of the third transistor T3.

The connecting portion 174 is electrically connected to the second scan line 152 and the lower pattern 111c through the contact hole 68 of the buffer layer 120 and the second insulating layer 160 or through the two contact holes 24 of the second insulating layer 160, and thus may electrically connect the second scan line 152 and the lower pattern 111c to each other. The lower pattern 111c may correspond to the third transistor T3, and may overlap the channel region 134c of the active pattern 130c.

The connecting portion 176 is electrically connected to the first scan line 151 and the lower pattern 111b through two contact holes 26 of the buffer layer 120 and the second insulating layer 160 or of the second insulating layer 160, and thus may electrically connect the first scan line 151 and the lower pattern 111b to each other. The lower pattern 111b may correspond to the second transistor T2, and may overlap the channel region 134b of the active pattern 130b.

The connecting portion 177 is electrically connected to the drain region 135c of the active pattern 130c through at least one contact hole 63 (two contact holes 63 are shown in one pixel PX1, PX2, or PX3 in FIG. 2) of the second insulating layer 160 in each of the pixels PX1, PX2, and PX3, and is electrically connected to the horizontal initializing voltage line 153 through the contact hole 67 of the second insulating layer 160, and thus the drain region 135c of the active pattern 130c may be electrically connected to the horizontal initializing voltage line 153. Accordingly, the drain region 135c of the third transistor T3 may be electrically connected to the initializing voltage line 173 and the horizontal initializing voltage line 153 for transmitting the initializing voltage INT.

The horizontal initializing voltage line 153 extends in the first direction DR1 across the three adjacent pixels PX1, PX2, and PX3, but may be disposed between two adjacent common voltage lines 170 and may not intersect the two common voltage lines 170. The horizontal initializing voltage line 153 may intersect the three neighboring data lines 171a, 171b, and 171c, and may extend only to the initializing voltage line 173 to be electrically connected to the initializing voltage line 173 through the contact hole 69 of the second insulating layer 160.

The connecting portion 178 is electrically connected to the drain region 135b of the active pattern 130b through at least one contact hole 65 (two contact holes 65 are shown in each of one pixels PX1, PX2, and PX3 in FIG. 2) of the second insulating layer 160 in each of the pixels PX1, PX2, and PX3, and is electrically connected to the extension portion 155a of the driving gate electrode 155 through the contact hole 66 of the second insulating layer 160, and thus the drain region 135b of the active pattern 130b and an extension portion 155a of the driving gate electrode 155 may be electrically connected to each other. Thus, the drain region 135b of the second transistor T2 may be electrically connected to the first gate electrode 154a through the driving gate electrode 155.

At least one of the first conductive layer, the second conductive layer, and the third conductive layer may include at least one of, for example, copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. Each of the first conductive layer, the second conductive layer, and the third conductive layer may have a single layer or multilayer structure.

In an exemplary embodiment of the present invention, the third conductive layer may have a multilayer structure including a lower layer containing titanium (Ti) and an upper layer containing copper (Cu).

The first transistor T1 includes the channel region 134a, the source region 133a, the drain region 135a, and the first gate electrode 154a. Since the source region 133a of the first transistor T1 is electrically connected to the driving voltage line 172a, the horizontal driving voltage line 172b, and the driving voltage patterns 172c and 172d, the driving voltage ELVDD may be applied thereto.

The lower pattern 111a corresponding to the first transistor T1 overlaps the channel region 134a between the channel region 134a of the first transistor T1 and the substrate 110 so that the external light does not reach the channel region 134a, thereby reducing a leakage current and degradation of characteristics. For example, in an exemplary embodiment of the present invention, the lower pattern 111a may overlap the entire channel region 134a. In addition, the lower pattern 111a may include an additional area surrounding the portion overlapping the channel region 134a to block obliquely incident light. The lower pattern 111a is electrically connected to the drain region 135a of the first transistor T1 through the capacitor electrode 175. For example, the connecting portion 175a of the capacitor electrode 175 may be connected to the drain region 135a of the first transistor T1 and the source region 133c of the third transistor T3 through the contact holes 62, while the connecting portion 175a of the capacitor electrode 175 may be connected to the lower pattern 111a through the contact hole 68. The second transistor T2 includes the channel region 134b, the source region 133b, the drain region 135b, and the second gate electrode 154b. The source region 133b of the second transistor T2 may be electrically connected to the data lines 171a, 171b, and 171c to receive the data voltage DAT or a reference voltage. The drain region 135b of the second transistor T2 may be electrically connected to the first gate electrode 154a through the driving gate electrode 155.

The lower pattern 111b corresponding to the second transistor T2 overlaps the channel region 134b between the channel region 134b of the second transistor T2 and the substrate 110 so that the external light does not reach the channel region 134b, thereby reducing a leakage current and degradation of characteristics. For example, in an exemplary embodiment of the present invention, the lower pattern 111b may overlap the entire channel region 134b. In addition, the lower pattern 111b may include an additional area surrounding the portion overlapping the channel region 134b to block obliquely incident light. The lower pattern 111b may be electrically connected to the first scan line 151 to form a dual gate electrode of the second transistor T2 together with the second gate electrode 154b. For example, the connecting portion 176 may be electrically connected to the first scan line 151 and the lower pattern 111b through two contact holes 26, while the second gate electrode 154b of the second transistor T2 may be connected to the first scan line 151 for transmitting the first scan signal SC. Thus, the lower pattern 111b may be electrically connected to the second gate electrode 154b to form a dual gate electrode for the second transistor T2, in which the channel region 134b may overlap both the lower pattern 111b and the second gate electrode 154b with channel region 134b disposed therebetween.

The third transistor T3 includes the channel region 134c, the source region 133c, the drain region 135c, and the third gate electrode 154c. The drain region 135c of the third transistor T3 may receive the initializing voltage INT from the horizontal initializing voltage line 153.

The lower pattern 111c corresponding to the third transistor T3 overlaps the channel region 134c between the channel region 134c of the third transistor T3 and the substrate 110 so that the external light does not reach the channel region 134c, thereby reducing a leakage current and degradation of characteristics. For example, in an exemplary embodiment of the present invention, the lower pattern 111c may overlap the entire channel region 134c. In addition, the lower pattern 111c may include an additional area surrounding the portion overlapping the channel region 134c to block obliquely incident light. The lower pattern 111c may be electrically connected to the second scan line 152 to form a dual gate electrode of the third transistor T3 together with the third gate electrode 154c. For example, the connecting portion 174 may be electrically connected to the second scan line 152 and the lower pattern 111c through the contact hole 68, while the third gate electrode 154c of the third transistor T3 may be connected to the second scan line 152 for transmitting a second scan signal SS. Thus, the lower pattern 111c may be electrically connected to the third gate electrode 154c to form a dual gate electrode for the third transistor T3, in which the channel region 134c may overlap both the lower pattern 111c and the third gate electrode 154c with channel region 134c disposed therebetween.

A third insulating layer 181 may be disposed on the second insulating layer 160 and the third conductive layer. The third insulating layer 181 may include a contact hole 83a disposed on the capacitor electrode 175, a contact hole 89a disposed on the end portion 179 of the data lines 171a, 171b, and 171c, and a contact hole 81 disposed on the common voltage line 170 (see FIGS. 2, 4 and 5).

A fourth conductive layer including a plurality of contact portions 190a, 190b, 190c, 190d, and 190e and an additional capacitor electrode 190p may be disposed on the third insulating layer 181.

Each of the contact portions 190a, 190b, and 190c may be respectively disposed in each of the pixels PX1, PX2, and PX3, and may be electrically connected to the capacitor electrode 175 through the contact hole 83a (see FIGS. 2 and 5). The contact portion 190d may be in contact with and electrically connected to the common voltage line 170 through the contact hole 81. The contact portion 190e may be in contact with and electrically connected to the end portion 179 of the data lines 171a, 171b, and 171c through the contact hole 89a. For example, the third conductive layer may include the data lines 171a, 171b, and 171c spaced apart from the capacitor electrode 175, and the fourth conductive layer may include the contact portion 190e disposed at the end portion 179 of the data lines 171a, 171b, and 171c and contacting the end portion 179 (see FIGS. 2 and 5).

The contact portions 190a, 190b, 190c, 190d and 190e may enhance adhesive force between the capacitor electrode 175, the common voltage line 170, and the end portion 179 of the data lines 171a, 171b, and 171c of the third conductive layer that respectively contacts therewith and another conductive layer, and may prevent oxidation of the third conductive layer. For example, when the upper layer of the third conductive layer contains copper (Cu), oxidation of the copper (Cu) may be prevented. To this end, the fourth conductive layer may include a conductive material capable of preventing corrosion of the upper layer of the third conductive layer. For example, when the upper layer of the third conductive layer contains copper (Cu), the fourth conductive layer may include a conductive material that may cap the upper layer of the third conductive layer to prevent corrosion of the copper (Cu). For example, the fourth conductive layer may include a conductive material such as a metal oxide such as, for example, indium tin oxide (ITO) or indium zinc oxide (IZO).

The additional capacitor electrode 190p may be disposed in each of the pixels PX1, PX2, and PX3 one by one. The additional capacitor electrode 190p is electrically separated from the contact portions 190a, 190b, and 190c of the respective pixels PX1, PX2, and PX3. The additional capacitor electrode 190p is connected to the driving gate electrode 155 through a contact hole 84 formed in the second insulating layer 160 and the third insulating layer 181 in the region overlapping the driving gate electrode 155 and not overlapping the capacitor electrode 175. Since the drain region 135b of the second transistor T2 may be electrically connected to the first gate electrode 154a through the driving gate electrode 155 as described above, the drain region 135b of the second transistor T2, the first gate electrode 154a, the driving gate electrode 155 and the additional capacitor electrode 190p may be electrically connected to each other. The additional capacitor electrode 190p may overlap a pixel electrode 191 without overlapping the contact portions 190a, 190b, and 190c. The pixel electrode 191 includes a plurality of pixel electrodes 191a, 191b, and 191c respectively corresponding to the pixels PX1, PX2, and PX3.

The additional capacitor electrode 190p may overlap the corresponding capacitor electrode 175 with the third insulating layer 181 disposed therebetween to form the second additional capacitor Cb. For example, the additional capacitor electrode 190p may be disposed in a layer, for example, the fourth conductive layer, between the capacitor electrode 175 and the anode of the light emitting diode ED, for example, the pixel electrode 191.

A fourth insulating layer 182 may be disposed on the third insulating layer 181 and the fourth conductive layer. The fourth insulating layer 182 may include a contact hole 83b disposed on the contact portions 190a, 190b, and 190c and overlapping the contact hole 83a, and a contact hole 89b disposed on the contact portion 190e and overlapping the contact hole 89a. A fifth insulating layer 350 disposed on the fourth insulating layer 182 may include an opening 356 corresponding to the contact hole 89b.

The contact portion 190e may be disposed at the end portion 179 of the data lines 171a, 171b, and 171c and contacting the end portion 179, in which the end portion 179 may be disposed in a pad region at an edge of the display device. Thus, the contact portion 190e may be exposed to the outside through the contact hole 89b, and may be electrically connected to a separate driving circuit chip, a circuit film, or a circuit board.

At least one of the buffer layer 120, the first insulating layer, the second insulating layer 160, the third insulating layer 181, and the fourth insulating layer 182 may include an inorganic insulating material such as, for example, a silicon nitride ($SiN_x$), a silicon oxide ($SiO_x$), and a silicon oxynitride (SiON), and/or an organic insulating material. Particularly, the fourth insulating layer 182 may include an inorganic insulating material and/or an organic insulating material such as, for example, a polyimide, an acrylic-based polymer, a siloxane-based polymer, and the like, and may have a substantially flat upper surface.

A pixel electrode layer including a plurality of pixel electrodes 191a, 191b, and 191c may be disposed as a fifth conductive layer on the fourth insulating layer 182. As shown in FIG. 2, The pixel electrodes 191a, 191b, and 191c may be disposed to respectively correspond to the pixels PX1, PX2, and PX3. Planar sizes and shapes of the pixel electrodes 191a, 191b, and 191c disposed at three neighboring pixels PX1, PX2, and PX3 may be different from each other, but the present invention is not limited thereto. For example, in the three pixels PX1, PX2, and PX3, the planar sizes of the pixel electrodes 191a, 191b, and 191c may be reduced in the order of the pixel electrode 191b, the pixel electrode 191a, and the pixel electrode 191c, and in this case, the pixel PX2 may display a green color, the pixel PX1 may display a red color, and the pixel PX3 may display a blue color.

The pixel electrodes 191a, 191b, and 191c may respectively contact the contact portions 190a, 190b, and 190c through the contact hole 83b, and may be electrically connected to the capacitor electrode 175 through the contact portions 190a, 190b, and 190c. Accordingly, each of the pixel electrodes 191a, 191b, and 191c may be electrically connected to the drain region 135a of the first transistor T1 to receive a voltage from the first transistor T1. The capacitor electrode 175 is electrically connected to the lower pattern 111a through the contact hole 68 of the second insulating layer 160 and the buffer layer 120, and thus, the lower pattern 111a, the capacitor electrode 175, and the pixel electrodes 191a, 191b, and 191c may be electrically connected to each other.

The pixel electrode layer may include a semi-transmissive conductive material or a reflective conductive material. In an exemplary embodiment of the present invention, the semi-transmissive conductive material or a reflective conductive material may include a metal such as, for example, magnesium (Mg), silver (Ag), gold (Au), calcium (Ca), lithium (Li), chromium (Cr), aluminum (Al), or copper (Cu), or an alloy thereof.

The additional capacitor electrode 190p may overlap the corresponding pixel electrodes 191a, 191b, and 191c with the fourth insulating layer 182 disposed therebetween to form the first additional capacitor Ca.

The fifth insulating layer 350 may be disposed on the fourth insulating layer 182. The fifth insulating layer 350 has an opening 355 disposed on the pixel electrodes 191a, 191b, and 191c. The fifth insulating layer 350 may include an organic insulating material such as, for example, a polyacrylic-based resin or a polyimide-based resin.

A light emitting layer 370 is disposed on the fifth insulating layer 350 and the pixel electrode layer. The light emitting layer 370 may include a portion disposed in the opening 355 of the fifth insulating layer 350, and may include an organic light emitting material or an inorganic light emitting material. At least some of the fifth insulating layer 350 may not be covered by the light emitting layer 370.

The fifth insulating layer 350 and the light emitting layer 370 may include a contact hole 82 disposed on the contact portion 190d.

A common electrode 270 is disposed on the light emitting layer 370, and may be continuously formed across the plurality of pixels PX1, PX2, and PX3. The common electrode 270 is in contact with the contact portion 190d through the contact hole 82 and is electrically connected to the common voltage line 170 to receive the common voltage ELVSS.

The common electrode 270 may include a conductive transparent material. In an exemplary embodiment of the present invention, the common electrode 270 may include a transparent conductive oxide, and the transparent conductive oxide may include but are not limited to: indium tin oxide (ITO), indium zinc oxide (IZO), zinc oxide (ZnO), indium oxide ($In_2O_3$), etc.

The pixel electrodes 191a, 191b, and 191c of the pixels PX1, PX2, and PX3, the light emitting layer 370, and the common electrode 270 together form the light emitting diode ED, and one of the pixel electrode 191a, 191b, or 191c and the common electrode 270 becomes a cathode, and the other becomes an anode. The example in which the pixel electrode 191a, 191b, or 191c becomes the anode and the common electrode 270 becomes the cathode has been described above.

Hereinafter, a display device according to an exemplary embodiment of the present invention will be described with reference to FIG. 6. Features that are different from the above-described exemplary embodiments of FIG. 1 to FIG. 5 will be mainly described.

Figure 6:
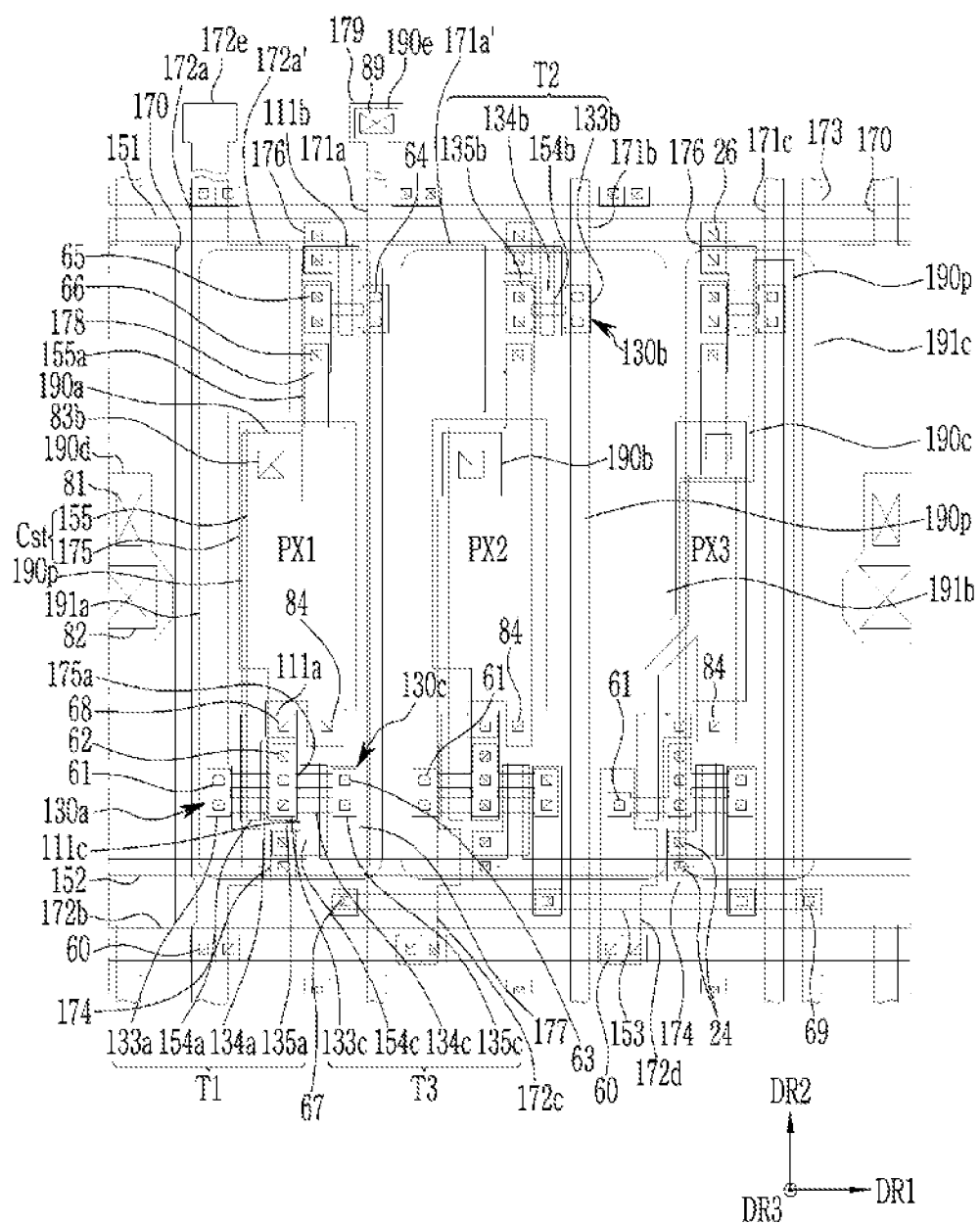
FIG. 6 is a plan layout view of a pixel region of a display device according to an exemplary embodiment of the present invention.

FIG. 6 is a plan layout view of a pixel region of a display device according to an exemplary embodiment of the present invention.

Compared with the exemplary embodiment of FIG. 2, the contact hole 83a formed in the third insulating layer 181 and the contact hole 83b formed in the fourth insulating layer 182 are disposed in a lower position in the second direction DR2 in a plan view. Here, a position of the contact hole 83b is lower in the second direction DR2 may mean that the position moves farther away from the first scan line 151 towards the second scan line 152 as shown in FIG. 2. For example, the contact hole 83a and the contact hole 83b may be disposed in a region overlapping the driving gate electrode 155. An area (or width) occupied by the capacitor electrode 175 is reduced, and an adjacent driving voltage line 172a or adjacent data lines 171a, 171b, and 171c may extend, for example, in the first direction DR1, and may be disposed in an area secured by a reduced area of the capacitor electrode 175.

As shown in FIG. 6, the driving voltage line 172a adjacent to the area secured by the reduced area of the capacitor electrode 175 may include a voltage line extension portion 172a' disposed in the secured area. The voltage line extension portion 172a' may protrude in the first direction DR1 from the driving voltage line 172a extending in the second direction DR2, and may be disposed adjacent to the capacitor electrode 175. Resistance of the driving voltage line 172a may decrease by including the voltage line extension portion 172a'.

As illustrated in FIG. 6, the data line 171a adjacent to the area secured by the reduced area of the capacitor electrode 175 may include a data line extension portion 171a' disposed in the secured area. The data line extension portion 171a' may protrude in the first direction DR1 from the data line 171a extending in the second direction DR2, and may be disposed adjacent to the capacitor electrode 175. Resistance of the data line 171a may decrease by including the data line extension portion 171a'.

In FIG. 6, it is exemplarily described that the driving voltage line 172a includes the voltage line extension portion 172a' and the data line 171a includes the data line extension portion 171a', but the present invention is not limited thereto. For example, other data lines 171b and 171c may be formed to include extension portions disposed in the secured area.

Except for the above-described differences, the features of the exemplary embodiment described above with reference to FIG. 1 to FIG. 5 may be wholly applied to the exemplary embodiment described with reference to FIG. 6, so redundant descriptions are omitted.

Hereinafter, a display device according to an exemplary embodiment of the present invention will be described with reference to FIG. 7 to FIG. 11. The exemplary embodiments shown in FIG. 7 to FIG. 11 are different from the exemplary embodiments shown in FIG. 1 to FIG. 5 described above, but the same reference numerals are used for corresponding elements for convenience sake, and in this case, functions of the corresponding elements may be the same, but their planar or cross-sectional structures may be slightly different.

Figure 7:
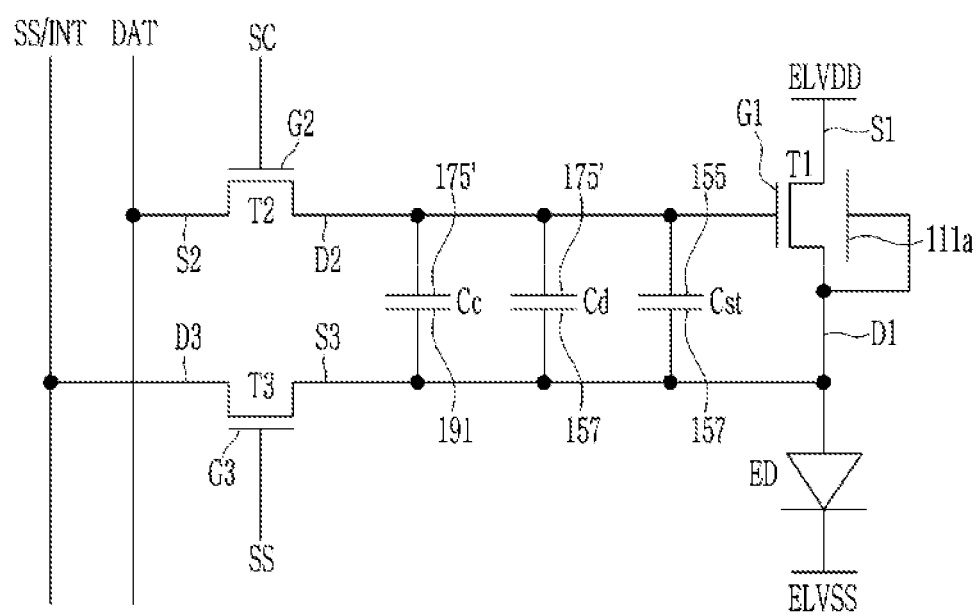
FIG. 7 is an equivalent circuit diagram of one pixel of a display device according to an exemplary embodiment of the present invention.

FIG. 7 is an equivalent circuit diagram of one pixel of a display device according to an exemplary embodiment of the present invention.

Referring to FIG. 7, the display device includes a plurality of pixels, and one of the plurality of pixels may include the plurality of transistors T1, T2, and T3, the storage capacitor Cst, additional capacitors Cc and Cd, and the light emitting diode ED. The additional capacitors Cc and Cd may include a first additional capacitor Cc and a second additional capacitor Cd. In the present exemplary embodiment, one pixel including one light emitting diode ED will be exemplarily described.

The plurality of transistors T1, T2, and T3 include a first transistor T1, a second transistor T2, and a third transistor T3. A source electrode and a drain electrode, which will be described below, are used to distinguish two electrodes disposed on opposite sides of a channel of each of the transistors T1, T2, and T3, and they may be interchanged without affecting the functions thereof.

The gate electrode G1 of the first transistor T1 is connected to one end of the storage capacitor Cst. The gate electrode G1 of the first transistor T1 may also be connected to one end of the first additional capacitor Cc, and one end of the second additional capacitor Cd. The source electrode S1 of the first transistor T1 is connected to a driving voltage line for transmitting a driving voltage ELVDD. The drain electrode D1 of the first transistor T1 is connected to the anode of the light emitting diode ED and the other end of the storage capacitor Cst. The drain electrode D1 of the first transistor T1 may also be connected to the other end of the first additional capacitor Cc, and the other end of the second additional capacitor Cd. The first transistor T1 may receive the data voltage DAT according to a switching operation of the second transistor T2, store the data voltage DAT in the storage capacitor Cst and the additional capacitors Cc and Cd, and supply a driving current to the light emitting diode ED according to the stored voltage stored in the storage capacitor Cst and the additional capacitors Cc and Cd.

In an exemplary embodiment of the present invention, the first transistor T1 may further include the lower pattern 111a under the semiconductor layer at which the channel is disposed. The lower pattern 111a overlaps the channel and the gate electrode G1 of the first transistor T1 to enhance characteristics of the first transistor T1 and to maintain a voltage of the gate electrode G1. The voltage of the gate electrode G1 may be maintained by the overlapping of the lower pattern 111a and the gate electrode G1 to assist a role of the storage capacitor Cst. Hereinafter, a capacitor added by overlapping between the lower pattern 111a and the gate electrode of the first transistor T1 is referred to as an overlap capacitor. The lower pattern 111a is electrically connected to the drain electrode D1 of the first transistor T1, thus it is also connected to the anode of the light emitting diode ED. Accordingly, the lower pattern 111a may also be connected to the other ends of the storage capacitor Cst, the first additional capacitor Cc, and the second additional capacitor Cd.

The gate electrode G2 of the second transistor T2 is connected to a first scan line for transmitting the first scan signal SC. The source electrode S2 of the second transistor T2 is connected to a data line capable of transmitting the data voltage DAT or the reference voltage. The drain electrode D2 of the second transistor T2 is connected to the gate electrode G1 of the first transistor T1. The drain electrode D2 of the second transistor T2 may be connected to one end of the storage capacitor Cst, and one ends of the additional capacitors Cc and Cd. The second transistor T2 is turned on in response to the first scan signal SC to be able to transmit the reference voltage or the data voltage DAT to the gate electrode G1 of the first transistor T1, one end of the storage capacitor Cst, and one ends of the additional capacitors Cc and Cd.

The gate electrode G3 of the third transistor T3 is connected to a second scan line for transmitting the second scan signal SS. The source electrode S3 of the third transistor T3 is connected to the other end of the storage capacitor Cst, the drain electrode D1 of the first transistor T1, and the anode of the light emitting diode ED. The source electrode S3 of the third transistor T3 may also be connected to the other end of the first additional capacitor Cc, and to the other end of the second additional capacitor Cd. The drain electrode D3 of the third transistor T3 is connected to an initializing voltage line for transmitting the initializing voltage INT. The initializing voltage line may be used as a wire for providing the initializing voltage INT and for sensing a voltage of the anode of the light emitting diode ED connected to the source electrode S3 of the third transistor T3 according to a section. The third transistor T3 is turned on in response to the second scan signal SS to transmit the initializing voltage INT to the anode of the light emitting diode ED, the other end of the storage capacitor Cst, and the other ends of the additional capacitors Cc and Cd, thereby initializing the anode voltage of the light emitting diode ED. When the second scan signal SS is applied as a gate-on voltage in a light emitting section in which the light emitting diode ED emits light, the initializing voltage line operates as a sensing line, and thus the anode voltage of the light emitting diode ED may be transmitted to a sensing portion through the sensing line. When the voltage sensed through the sensing line is determined to be different from an expected anode voltage based on the applied data voltage DAT, the data voltage DAT may be modified to be provided to the pixel. That is, characteristics of the first transistor T1 may be changed, and by sensing the changed characteristics thereof to provide the data voltage DAT corresponding thereto, it is possible to allow the light emitting diode ED to normally emit light. For example, the data voltage DAT modification based on the voltage sensed through the sensing line as described above can be carried out for a predetermined time allowed during the operation of a screen. Thus, it is possible to sense and compensate for the characteristics, that change in real time, of the first transistor T1, and to allow the light emitting diode ED to normally emit light.

One end of the storage capacitor Cst is connected to the gate electrode G1 of the first transistor T1. The other end of the storage capacitor Cst is connected to the source electrode S3 of the third transistor T3 and the anode of the light emitting diode ED. One end of the storage capacitor Cst and the other end of the storage capacitor Cst may be two conductive electrodes facing each other with one insulating layer interposed therebetween. For example, one end of the storage capacitor Cst may correspond to the driving gate electrode 155 to be described, and the other end of the storage capacitor Cst may correspond to a capacitor electrode 157 to be described. The driving gate electrode 155 may be connected to the first gate electrode 154a to be described, and the capacitor electrode 157 may overlap the driving gate electrode 155 to form the storage capacitor Cst.

The storage capacitor Cst may serve to maintain the data voltage DAT and the anode voltage of the light emitting diode ED (the voltage of the drain electrode D1 of the first transistor T1) for one frame.

As an area occupied by pixels in an organic light emitting display device with high resolution is reduced, an area for forming the storage capacitor Cst is reduced, thus a storage capacity that may be maintained for one frame may not be secured. Therefore, the pixel according to the present exemplary embodiment further includes the additional capacitors Cc and Cd to ensure a sufficient storage capacity for maintaining the anode voltage of the light emitting diode ED for one frame.

One end of the first additional capacitor Cc is connected to the gate electrode G1 of the first transistor T1. The other end of the first additional capacitor Cc is connected to the source electrode S3 of the third transistor T3 and the anode of the light emitting diode ED. One end of the first additional capacitor Cc may correspond to an additional capacitor electrode 175' to be described (see FIGS. 7 and 9), and the other end of the first additional capacitor Cc may correspond to a pixel electrode 191 which includes pixel electrodes 191a, 191b, and 191c to be described (see FIGS. 7 and 9). The additional capacitor electrode 175' may overlap the capacitor electrode 157, and the pixel electrode 191 may correspond to an anode of the light emitting diode ED. For example, the pixel electrode 191a may overlap the additional capacitor electrode 175' (see FIG. 9).

One end of the second additional capacitor Cd is connected to the gate electrode G1 of the first transistor T1. The other end of the second additional capacitor Cd is connected to the source electrode S3 of the third transistor T3 and the anode of the light emitting diode ED. One end of the second additional capacitor Cd corresponds to the additional capacitor electrode 175' to be described, and the other end of the second additional capacitor Cd may correspond to a capacitor electrode 157 to be described (see FIGS. 7 and 9).

The first additional capacitor Cc and the second additional capacitor Cd in combination with the storage capacitor Cst may serve to maintain the data voltage DAT and the anode voltage of the light emitting diode ED. That is, the first additional capacitor Cc and the second additional capacitor Cd may assist the storage capacitor Cst in ensuring the storage capacity capable of maintaining the anode voltage of the light emitting diode ED during one frame. In an exemplary embodiment of the present invention, an overlap capacitor may be further formed by the lower pattern 111a. For example, the lower pattern 111a may overlap the first gate electrode 154a of the first transistor T1 to form the overlap capacitor.

In an exemplary embodiment of the present invention, the pixel may only include the first additional capacitor Cc, or may only include the second additional capacitor Cd. In addition, adjacent pixels may include the additional capacitors Cc and Cd of different sizes. In an exemplary embodiment of the present invention, the pixel may include one or more additional capacitors besides the additional capacitors Cc and Cd.

The cathode of the light emitting diode ED is connected to a common voltage line for transmitting the common voltage ELVSS. The light emitting diode ED may emit light according to a driving current outputted from the first transistor T1. For example, the first transistor T1 is a driving transistor that supplies the driving current to the light emitting diode ED to drive the light emitting diode ED.

Figure 8:
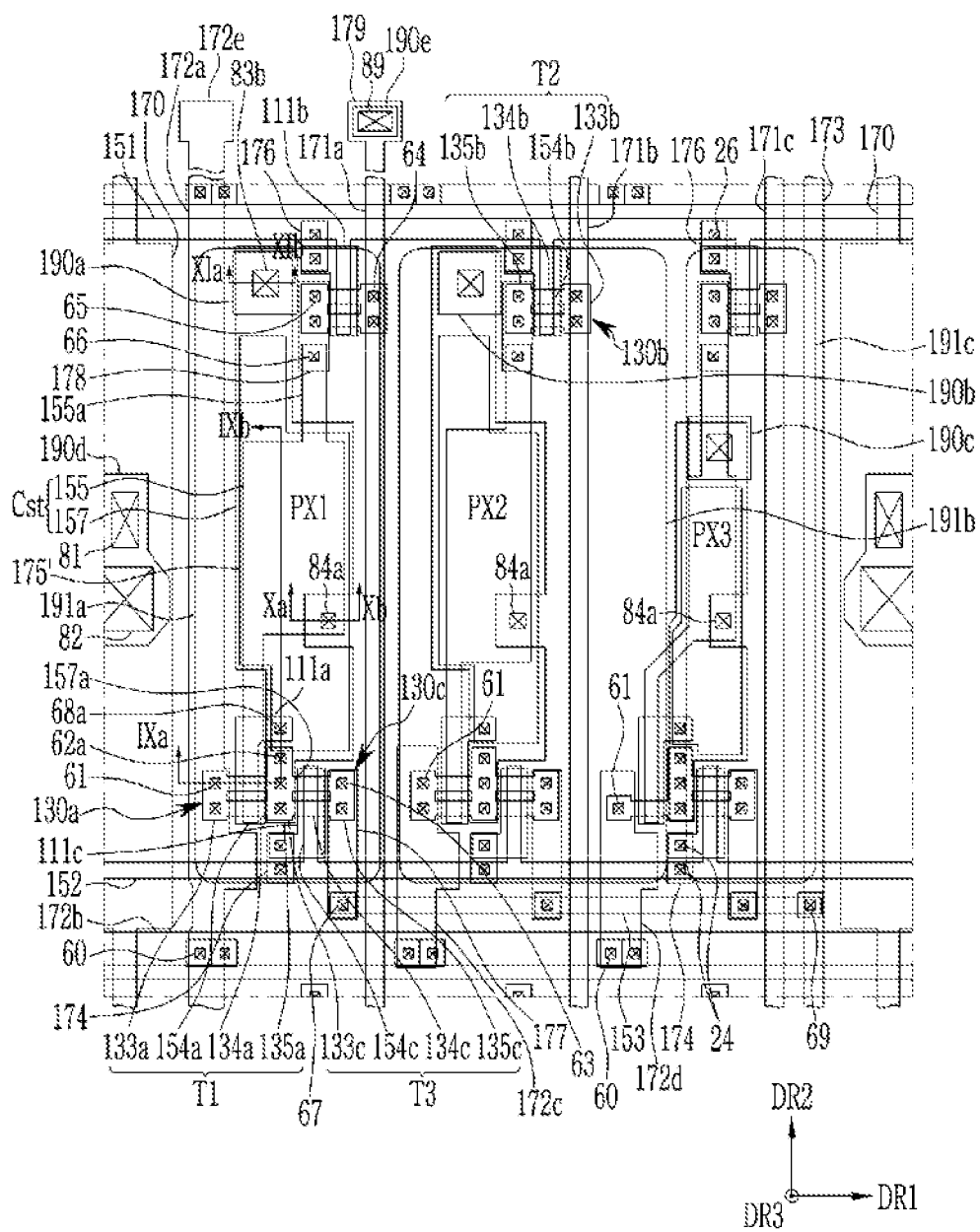
FIG. 8 is a plan layout view of a pixel region of a display device according to an exemplary embodiment of the present invention.
Figure 9:
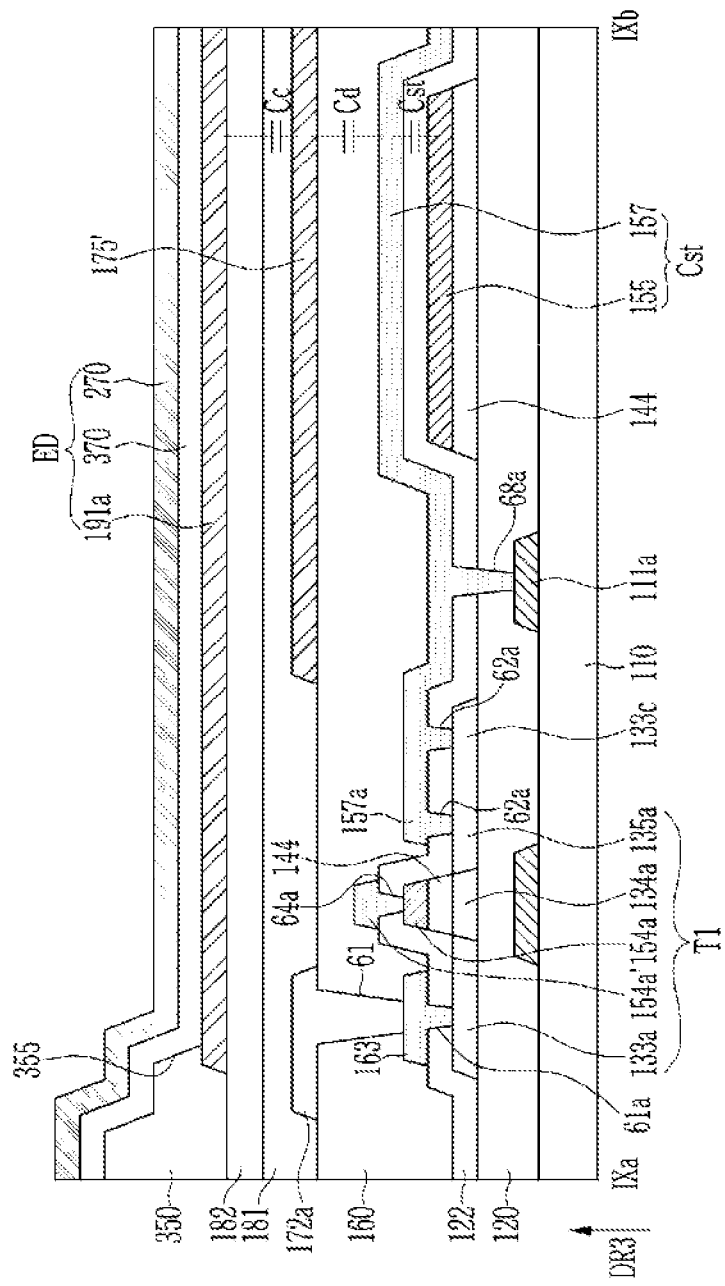
FIG. 9 is a cross-sectional view taken along line IXa-IXb of FIG. 8.
Figure 10:
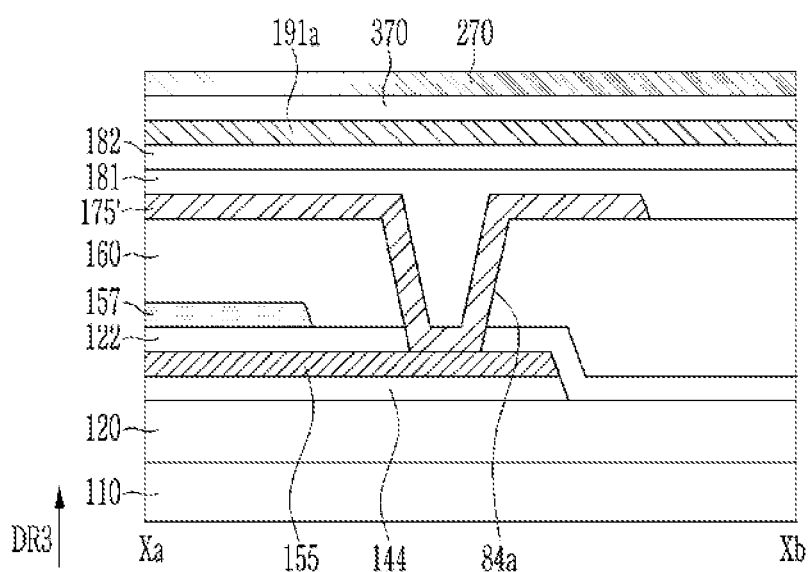
FIG. 10 is a cross-sectional view taken along line Xa-Xb of FIG. 8.
Figure 11:
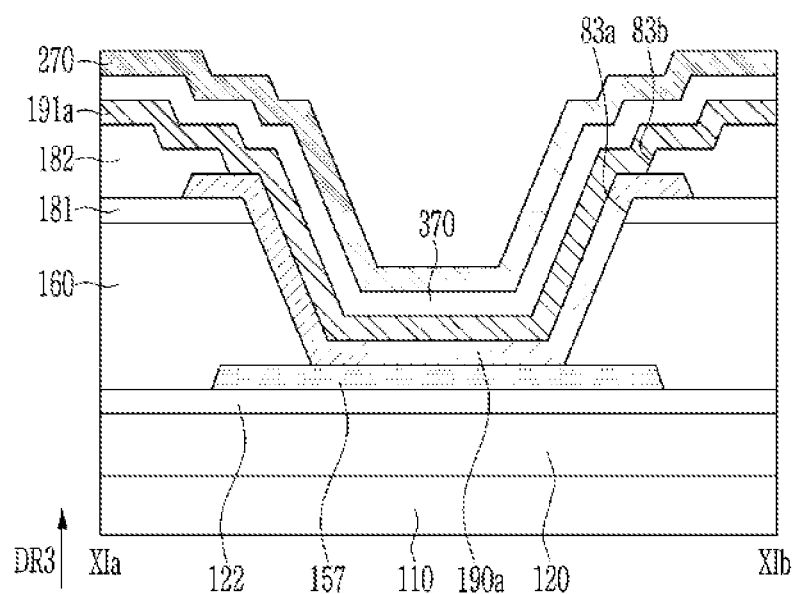
FIG. 11 is a cross-sectional view taken along line XIa-XIb of FIG. 8.

FIG. 8 is a plan layout view of a pixel region of a display device according to an exemplary embodiment of the present invention. FIG. 9 is a cross-sectional view taken along line IXa-IXb of FIG. 8. FIG. 10 is a cross-sectional view taken along line Xa-Xb of FIG. 8. FIG. 11 is a cross-sectional view taken along line XIa-XIb of FIG. 8. Features that are different from the above-described embodiments of FIG. 2 to FIG. 5 will be mainly described, and redundant descriptions are omitted.

Referring to FIG. 8 to FIG. 11, the display device further includes a sixth insulating layer 122 disposed on the second conductive layer and the buffer layer 120, and a sixth conductive layer disposed between the sixth insulating layer 122 and the second insulating layer 160. Thus, the sixth insulating layer 122 may also be disposed between the second conductive layer and the second insulating layer 160.

The sixth insulating layer 122 may contact the upper surfaces of the conductive regions of the active patterns 130a, 130b, and 130c. The sixth insulating layer 122 may include a contact hole 61a corresponding to and overlapping the contact holes 61 of the second insulating layer 160, and contact holes 62a, 64a, and 68a.

The sixth conductive layer may include the capacitor electrode 157. That is, the display device of the present exemplary embodiment does not include the capacitor electrode 175 described in FIG. 1 to FIG. 5, but may instead include the capacitor electrode 157 disposed in the sixth conductive layer. The capacitor electrode 157 may be electrically connected to the drain region 135a of the active pattern 130a through the contact hole 62a. The capacitor electrode 157 may overlap most of the corresponding driving gate electrode 155 with the sixth insulating layer 122 disposed therebetween to form the storage capacitor Cst.

The capacitor electrode 157 may include a downwardly protruding connecting portion 157a, for example, protruding in the second direction DR2. The connecting portion 157a is connected to the drain region 135a of the active pattern 130a and the source region 133c of the active pattern 130c, in which the source region 133c is connected to the drain region 135a, through at least one contact hole 62a of the sixth insulating layer 122 (three contact holes 62a are shown in one pixel PX1, PX2, or PX3 in FIG. 8). The capacitor electrode 157 is electrically connected to the lower pattern 111a through the contact hole 68a of the sixth insulating layer 122 and the buffer layer 120 (the connection portion 157a is connected to the lower pattern 111a through the contact hole 68a in FIG. 9). For example, the lower pattern 111a may be electrically connected to the drain region 135a of the first transistor T1, and the source region 133c of the third transistor T3.

The sixth conductive layer may further include connecting patterns 163 and 154a' that are in contact with the lower conductive layer through the contact hole. For example, as shown in FIG. 9, the sixth conductive layer includes the connecting pattern 163 that is in contact with the source region 133a of the active pattern 130a through the contact hole 61a, and the driving voltage line 172a contacts and is electrically connected to the connecting pattern 163 through the contact hole 61 of the second insulating layer 160, thus it may be electrically connected to the source region 133a of the active pattern 130a. For example, the source region 133a of the first transistor T1 may be connected to the driving voltage line 172a for transmitting the driving voltage ELVDD. The sixth conductive layer includes the connecting pattern 154a' overlapping the first gate electrode 154a of the first transistor T1, and the connecting pattern 154a' may be electrically connected to the first gate electrode 154a through the contact hole 64a. The connecting pattern 154a' may function as a gate electrode of the first transistor T1.

The third conductive layer disposed on the second insulating layer 160 may include the plurality of data lines 171a, 171b, and 171c, the driving voltage line 172a, the common voltage line 170, the initializing voltage line 173, the additional capacitor electrode 175', the plurality of connecting portions 174, 176, 177, and 178, and the plurality of driving voltage patterns 172c and 172d. That is, the display device of the present exemplary embodiment does not include the additional capacitor electrode 190p described in FIG. 1 to FIG. 5, but may instead include the additional capacitor electrode 175' disposed in the third conductive layer. For example, the capacitor electrode 157 may be disposed in a layer, for example, the sixth conductive layer, between the first gate electrode 154a of the first transistor T1 and the driving voltage line 172a, and the additional capacitor electrode 175' may be disposed in a layer, for example, the third conductive layer, the same as that of the driving voltage line 172a.

The additional capacitor electrode 175' may be disposed one by one in each of the pixels PX1, PX2, and PX3. The additional capacitor electrode 175' is connected to the driving gate electrode 155 through a contact hole 84a formed in the second insulating layer 160 and the sixth insulating layer 122 in the region overlapping the driving gate electrode 155 and not overlapping the capacitor electrode 157 (see FIG. 10). The additional capacitor electrode 175' may be electrically separated from the driving voltage line 172a, the common voltage line 170, the initializing voltage line 173, the plurality of connecting portions 174, 176, 177, and 178, and the plurality of driving voltage patterns 172c and 172d.

The additional capacitor electrode 175' may overlap the majority of the corresponding capacitor electrode 157 with the second insulating layer 160 disposed therebetween to form the second additional capacitor Cd.

The second insulating layer 160 and the third insulating layer 181 may include the contact hole 83a disposed on the capacitor electrode 157 (see FIG. 11). The contact portions 190a, 190b, and 190c of the fourth conductive layer disposed on the third insulating layer 181 are respectively disposed in the pixels PX1, PX2, and PX3, and may contact and be electrically connected to the capacitor electrode 157 through the contact hole 83a.

The pixel electrodes 191a, 191b, and 191c may respectively contact the contact portions 190a, 190b, and 190c through the contact hole 83b, and may be electrically connected to the capacitor electrode 157 through the contact portions 190a, 190b, and 190c. The connecting portion 157a of the capacitor electrode 157 is connected to the drain region 135a. Accordingly, each of the pixel electrodes 191a, 191b, and 191c may be electrically connected to the drain region 135a of the first transistor T1 to receive a voltage from the first transistor T1.

The additional capacitor electrode 175' may overlap the corresponding pixel electrodes 191a, 191b, and 191c with the third insulating layer 181 and the fourth insulating layer 182 disposed therebetween to form the first additional capacitor Cc.

Except for the above-described differences, the features of the exemplary embodiments described above with reference to FIG. 2 to FIG. 5 may be wholly applied to the exemplary embodiments described with reference to FIG. 8 to FIG. 11, so redundant descriptions are omitted.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the present invention as defined by the appended claims.

What is claimed is:

1. A display device comprising:
a substrate;
a first conductive layer including a lower pattern disposed on the substrate;
a first insulating layer disposed on the first conductive layer;
an active pattern disposed on the first insulating layer and including a source region, a channel region, and a drain region;
a second conductive layer disposed on the active pattern and including a gate electrode overlapping the channel region and a driving gate electrode connected to the gate electrode;
a second insulating layer disposed on the second conductive layer;
a third conductive layer disposed on the second insulating layer and including a capacitor electrode overlapping the driving gate electrode;
a third insulating layer disposed on the third conductive layer;
a fourth conductive layer disposed on the third insulating layer and including an additional capacitor electrode overlapping the capacitor electrode;
a fourth insulating layer disposed on the fourth conductive layer; and
a pixel electrode layer including a pixel electrode disposed on the fourth insulating layer,
wherein the driving gate electrode and the capacitor electrode form a storage capacitor, the pixel electrode and the additional capacitor electrode form a first additional capacitor, and the capacitor electrode and the additional capacitor electrode form a second additional capacitor.

2. The display device of claim 1, wherein the driving gate electrode and the additional capacitor electrode are electrically connected to each other.

3. The display device of claim 2, wherein the additional capacitor electrode is connected to the driving gate electrode through a contact hole formed in the second insulating layer and the third insulating layer in a region overlapping the driving gate electrode and not overlapping the capacitor electrode.

4. The display device of claim 2, wherein the lower pattern, the capacitor electrode, and the pixel electrode are electrically connected to each other.

5. The display device of claim 1, wherein the lower pattern overlaps the gate electrode to form an overlap capacitor.

6. The display device of claim 1, wherein the third conductive layer further includes a data line spaced apart from the capacitor electrode, and the fourth conductive layer further includes a first contact portion disposed at an end portion of the data line and contacting the end portion.

7. The display device of claim 1, wherein the fourth conductive layer further includes a second contact portion disposed between the pixel electrode and the capacitor electrode and contacting the pixel electrode and the capacitor electrode.

8. The display device of claim 7, wherein the additional capacitor electrode is electrically separated from the second contact portion.

9. A display device comprising:
a substrate;
a first conductive layer including a lower pattern disposed on the substrate;
a first insulating layer disposed on the first conductive layer;
an active pattern disposed on the first insulating layer and including a source region, a channel region, and a drain region;
a second conductive layer disposed on the active pattern and including a gate electrode overlapping the channel region and a driving gate electrode connected to the gate electrode;
a second insulating layer disposed on the second conductive layer;
a third conductive layer disposed on the second insulating layer and including a data line and an additional capacitor electrode;
a third insulating layer disposed on the third conductive layer;
a fourth conductive layer disposed on the third insulating layer and including a first contact portion disposed on an end portion of the data line and contacting the end portion;
a fourth insulating layer disposed on the fourth conductive layer;
a pixel electrode layer as a fifth conductive layer including a pixel electrode disposed on the fourth insulating layer;
a fifth insulating layer disposed on the fourth insulating layer;
a sixth insulating layer disposed between the second conductive layer and the second insulating layer; and
a sixth conductive layer disposed between the sixth insulating layer and the second insulating layer and including a capacitor electrode overlapping the driving gate electrode,
wherein the driving gate electrode and the capacitor electrode form a storage capacitor, the pixel electrode and the additional capacitor electrode form a first additional capacitor, and the capacitor electrode and the additional capacitor electrode form a second additional capacitor.

10. The display device of claim 9, wherein the driving gate electrode and the additional capacitor electrode are electrically connected to each other.

11. The display device of claim 10, wherein the additional capacitor electrode is connected to the driving gate electrode through a contact hole formed in the second insulating layer and the sixth insulating layer in a region overlapping the driving gate electrode and not overlapping the capacitor electrode.

12. The display device of claim 10, wherein
the lower pattern, the capacitor electrode, and the pixel electrode are electrically connected to each other.

13. The display device of claim 9, wherein
the lower pattern overlaps the gate electrode to form an overlap capacitor.

14. The display device of claim 9, wherein
the fourth conductive layer further includes a second contact portion disposed between the pixel electrode and the capacitor electrode and contacting the pixel electrode and the capacitor electrode.

15. A display device comprising:
a substrate;
a first conductive layer comprising a lower pattern disposed on the substrate;
a first insulating layer disposed on the first conductive layer;
an active pattern disposed on the first insulating layer and comprising a first source region, a first channel region, and a first drain region of a first transistor;
a second conductive layer disposed on the active pattern and comprising a first gate electrode overlapping the lower pattern to form an overlap capacitor, and a driving gate electrode connected to the first gate electrode of the first transistor;
a second insulating layer disposed on the second conductive layer;
a third conductive layer disposed on the second insulating layer and comprising a capacitor electrode configured to overlap the driving gate electrode to form a storage capacitor;
a third insulating layer disposed on the third conductive layer;
a fourth conductive layer disposed on the third insulating layer and comprising an additional capacitor electrode configured to overlap the capacitor electrode to form a first additional capacitor;
a fourth insulating layer disposed on the fourth conductive layer; and
a pixel electrode layer comprising a pixel electrode disposed on the fourth insulating layer and configured to overlap the additional capacitor electrode to form a second additional capacitor.

16. The display device of claim 15, wherein
the first source region is connected to a driving voltage line that transmits a driving voltage, and the first drain region is connected to the pixel electrode that is an anode of a light emitting diode.

17. The display device of claim 15, further comprising:
a second transistor configured to be able to transmit a data voltage to the first transistor and comprising a second gate electrode, a second source region, a second channel region, and a second drain region,
wherein the second drain region, the first gate electrode, the driving gate electrode and the additional capacitor electrode are electrically connected to each other.

* * * * *